United States Patent
Feiweier

(10) Patent No.: US 7,821,266 B2
(45) Date of Patent: Oct. 26, 2010

(54) METHOD AND DEVICE FOR OPTIMIZATION OF IMAGING PARAMETERS

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 70 days.

(21) Appl. No.: 12/184,399

(22) Filed: Aug. 1, 2008

(65) Prior Publication Data
US 2009/0033328 A1 Feb. 5, 2009

(30) Foreign Application Priority Data
Aug. 3, 2007 (DE) .................... 10 2007 036 564

(51) Int. Cl.
G01V 3/00 (2006.01)
(52) U.S. Cl. .................................... 324/309
(58) Field of Classification Search ......... 324/300–322; 600/410–435
See application file for complete search history.

(56) References Cited

U.S. PATENT DOCUMENTS

| 5,218,299 A * | 6/1993 | Dunkel .................. 324/307 |
| 5,551,431 A | 9/1996 | Wells, III et al. |
| 5,572,125 A * | 11/1996 | Dunkel .................. 324/307 |
| 5,583,902 A | 12/1996 | Bae |
| 5,584,293 A | 12/1996 | Darrow et al. |
| 7,053,612 B2 * | 5/2006 | St. Pierre et al. ........... 324/307 |
| 7,388,973 B2 * | 6/2008 | Fidrich et al. ............... 382/128 |
| 7,613,496 B2 * | 11/2009 | Miyazaki et al. ........... 600/419 |
| 2007/0108976 A1 | 5/2007 | Morich et al. |

FOREIGN PATENT DOCUMENTS

EP 0 567 794 11/1993

OTHER PUBLICATIONS

"Simulation Procedure to Determine Nuclear Magnetic Resonance Imaging Pulse Sequence Parameters for Optimal Tissue Contrast," deGraaf et al., J. Nucl. Med., vol. 27., No. 2, (1986), pp. 281-286.

* cited by examiner

Primary Examiner—Brij B Shrivastav
Assistant Examiner—Dixomara Vargas
(74) Attorney, Agent, or Firm—Schiff Hardin LLP

(57) ABSTRACT

In a method and computerized device for determination of imaging parameters for the acquisition of a magnetic resonance image of an examination subject, initial imaging parameters are established, a calculation is made, based on the initial imaging parameters, of signal intensities for tissue types that occur at least in a portion of the examination subject, and the imaging parameters for the acquisition of the magnetic resonance image under are adapted dependent on the calculated signal intensities.

25 Claims, 3 Drawing Sheets

FIG 3
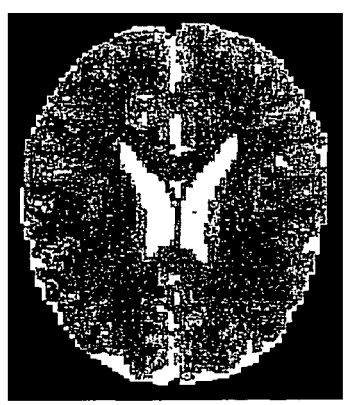
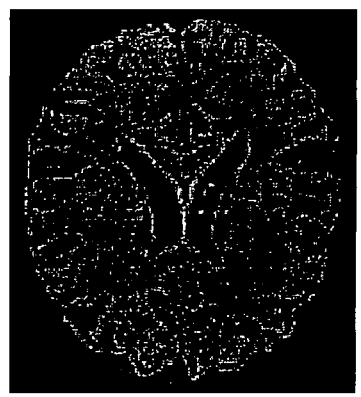
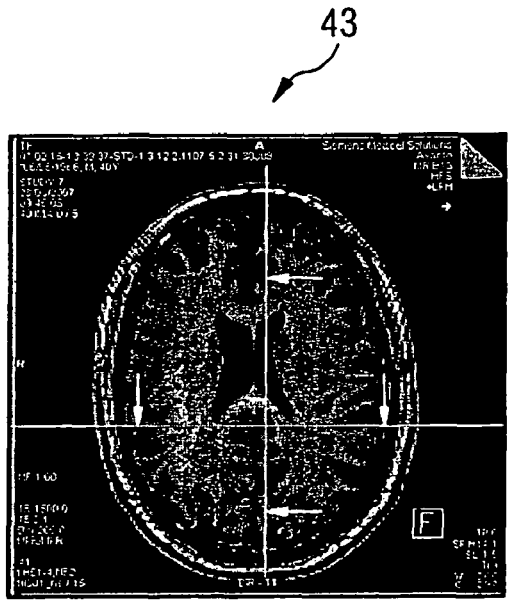

METHOD AND DEVICE FOR OPTIMIZATION OF IMAGING PARAMETERS

BACKGROUND OF THE INVENTION

1. Field of the Invention

The present invention concerns a method for determination of imaging parameters for the acquisition of an image of an examination subject with the use of an image acquisition device. The invention can be used in particular (but not exclusively) in the planning of examinations in a magnetic resonance (MR) system in which imaging parameters must be set for the acquisition of the individual MR images.

2. Description of the Prior Art

With increasing complexity of MR imaging methods, it is increasingly difficult and time-consuming for the operator to generate protocols with imaging sequences in which the set imaging parameters deliver the desired contrast and the required image quality. Variants of a three-dimensional acquisition method with the use of the gradient echo technique—such as, for example, turbo-flash imaging (MPRAGE—magnetization prepared rapidly acquired gradient echoes)—are examples. The setting of the imaging parameters is particularly difficult when optimized, central k-space scanning methods, variable flip angles and/or different preparation pulses are used in such imaging sequences. As a result, the image quality of the measured MR image may become clinically unusable given a change of an imaging parameter (such as, for example, the change of an excitation flip angle by 1°).

Protocol development, i.e. the determination of suitable imaging parameters for specific imaging sequences, essentially ensues with the use of a testing strategy in which, starting from an existing protocol that delivers an average image quality, the imaging parameters are iteratively optimized by measurements (data acquisitions) using measurement phantoms or using volunteer test subjects. This process is very time-consuming and cost-intensive, particularly in the case of imaging sequences with very long acquisition times. This is particularly true in the field of pediatric imaging, since there the MR-relevant tissue parameters differ distinctly form those for adults; dedicated imaging parameters must thus be determined, but test subject measurements naturally can be made only in a very limited manner in pediatrics.

SUMMARY OF THE INVENTION

It is therefore an object of the present invention to achieve optimized imaging parameters in a simple and fast manner.

This object is achieved in accordance with the invention by a method for determination of imaging parameters for the acquisition of a magnetic resonance image of an examination subject, wherein in a first step initial imaging parameters are established, typically by the operator. Signal intensities for tissue types that should occur in at least one part of the examination subject of which the MR image should be acquired are subsequently calculated with the use of these initial imaging parameters. The imaging parameters for the acquisition of the magnetic resonance image are then adapted with the use of these calculated signal intensities. The contrast to be expected and the image quality to be expected can be calculated from the calculated signal intensities without an actual measurement (data acquisition). The time expenditure for the calculation typically lies in the range of a few seconds or less. It is no longer necessary to conduct the measurement (possibly lasting multiple minutes) in order to receive an overview of how a measured MR image would look with the set initial imaging parameters. The present invention is not limited to the application with MR images. Theoretically, it is also applicable in the acquisition of any other image acquisition technique (such as, for example, in computed tomography). Due to the large number of adjustable parameters in the image generation by means of magnetic resonance, however, the selection of the correct imaging parameters can be difficult, such that MR images represent a preferred application example of the invention.

According to one embodiment, a simulation image that represents at least one part of the examination subject of which the magnetic resonance image should be acquired is generated on the basis of the calculated signal intensities, but the generation of a simulation image that is displayed to the user is not absolutely necessary. The optimization or adaptation of the imaging parameters can ensue solely on the basis of numerical values that can be calculated from the calculated signal intensities.

If a simulation image is calculated, then in another embodiment it is also possible to calculate and display a simulation image automatically for the selected imaging parameters given selection of a measurement protocol with predetermined imaging parameters. The operator therefore receives a first impression of the selected imaging parameters. Furthermore, it is also possible for a simulation image for each displayed image acquisition protocol to be displayed to the operator, so the operator in turn receives a better overview of the various measurement protocols.

If the calculated simulation image is displayed to the operator, the operator can virtually optimize the imaging parameters online and modify them in further steps so that overall a satisfactory image contrast with satisfactory signal-to-noise ratio is achieved. As an alternative to the calculation and display of a simulation image, it is also possible to determine and display only important image parameters such as contrast, sharpness and signal-to-noise.

For the calculation of the simulation image, the tissue proportions of a body region in the examination subject that should be considered for the calculation of the simulation image are advantageously determined. Furthermore, the body region should lie at least partially within the region of the examination subject of which the magnetic resonance image should be generated. This means that the body region to be examined should be fundamentally known with the proportions of the various tissues. Furthermore, the MR parameters such as T1 relaxation time, T2 relaxation time and proton density are advantageously determined for the tissue types considered for the calculation. For example, data known from the literature or values that are measured once and stored can be used. For example, a schematic image that, for example, is a segmented magnetic resonance image, can be used to determine the tissue proportions that should be considered for the calculation. Through segmentation of MR images it is possible in a known manner to separate different tissue types from one another. The proportion of a tissue or the proportions of all tissues in the total signal thus can be determined. Alternatively, schematic images (for example from anatomy atlases) can be used that allow a differentiation of the tissue types to be considered and are digitally available in a suitable form.

According to an embodiment of the invention, the signal intensity for every tissue type to be considered in k-space is determined. In one embodiment this signal intensity can be calculated on the basis of Bloch equations. As is explained below, the calculated signal intensity is a weighting for each k-space point and for each tissue proportion. An explicit solution of the Bloch equations is possible here based on the temporal sequence of the excitation and refocusing pulses. Furthermore, it is possible to suffice with an only approximate solution of the Bloch equations or an estimation of the signal evolution. Since the signal acquisition ensues in k-space (Fourier space), the calculated intensity value represents the calculated signal value in k-space. Furthermore, the proportions of each considered tissue proportion are determined in k-space, and the simulation image is determined by determining the signal intensity of the tissue type and the proportion of the tissue for at least one k-space value for each tissue type in question. If the quantity ratio of each tissue with the associated signal intensity is known for all tissue types that are expected to be present, for example, the simulation image can be calculated from this information.

As mentioned above, the tissue proportions to be considered can be calculated with the use of a schematic image that schematically reproduces the body region or the image plane to be examined. According to one embodiment of the invention, it is possible to generate from the schematic image a tissue proportion image for each tissue proportion to be considered. This means that a partial image for each tissue type, i.e. a partial tissue image, is generated from the segmented magnetic resonance image. As an alternative, it is also possible that such tissue proportion images are already present for each tissue proportion instead of the schematic image with the different tissues. After the calculation of the individual tissue proportion images, these can be normalized in an additional step. Various tissue proportions can be present at an image point. An example of tissue for which this is suitable is grey and white brain matter. By the normalization of the individual tissue proportion images it is ensured that the proportions of the individual tissue proportion images add to 100% in total. As an alternative, the normalization to the proton density is also possible, such that (for example) partial volume effects (i.e. finitely large image points contain more than one tissue type or proportionate air) can be considered.

In a further step, the resolution of the individual tissue proportion images can be adapted so as to correspond to the resolution of the MR image of the examination subject that should be acquired later. The tissue proportion images can then be Fourier-transformed in k-space, so it can be established at each k-space point, has the portion that each tissue proportion has of the total signal. The individual k-space data sets of the tissue proportion images represent an imaging of the individual tissue types in the measurement domain. These are weighted with the signal intensities mentioned above. A tissue-dependent signal intensity then can be generated for each tissue type in k-space by multiplication of the signal intensity for each tissue with the Fourier-transformed tissue proportion image. The simulation image can be calculated via addition of the tissue-dependent signal intensities in that a Fourier back-transformation ensues in image space.

To minimize the computation expenditure, the simulation image for a slice plane can be generated, or only a few representative simulation images for the various slices can be calculated. Furthermore, it is possible to calculate a simulation image respectively for each of the three orthogonal slice images (such as, for example, transverse, sagittal and coronary).

Furthermore, it can be very complicated to take the entire imaging sequence into account in the calculation of the signal intensity, i.e. to consider the entire progression of the gradient and radio-frequency pulses. To reduce this complication, it is possible to limit the simulation to a temporal sub-range of the imaging sequence. This sub-range can be, for example, the smallest repeating unit in the imaging sequence. Due to the periodicity of the measurement workflow with the repetition of excitation pulses and gradient switchings, it can suffice to simulate the smallest repeating unit from the imaging sequence. The signal intensity for the entirety of k-space can be determined from the simulation together with the k-space scan scheme predetermined by the measurement sequence (and thus known).

According to one embodiment, the initial imaging parameters are input by the user, and the imaging parameters can be modified and optimized by the user in light of the simulation image. However, it is just as likely that the user will predetermine boundary conditions for individual imaging parameters as well as, for example, a contrast response, and the imaging parameters are iteratively calculated using predetermined criteria. Exemplary criteria for this are the signal-to-noise ratio, the contrast response and what is known as the pixel function or point spread function (PSF). For example, the iterative method can be operated with a target function that should be optimized. For example, given such optimization methods it is possible to minimize the target function.

Furthermore, the invention concerns a device for optimization of the imaging parameters with a unit to establish the initial imaging parameters and a computer for calculation of the signal intensities. The device operates as described above. The invention likewise concerns a computer program product encoded with programming instructions that implement the method that is described above upon execution in a computer system.

BRIEF DESCRIPTION OF THE DRAWINGS

FIG. 3 shows an exemplary schematic image and a simulation image and the effectively acquired MR image in accordance with the invention.

DESCRIPTION OF THE PREFERRED EMBODIMENTS

Figure 1:
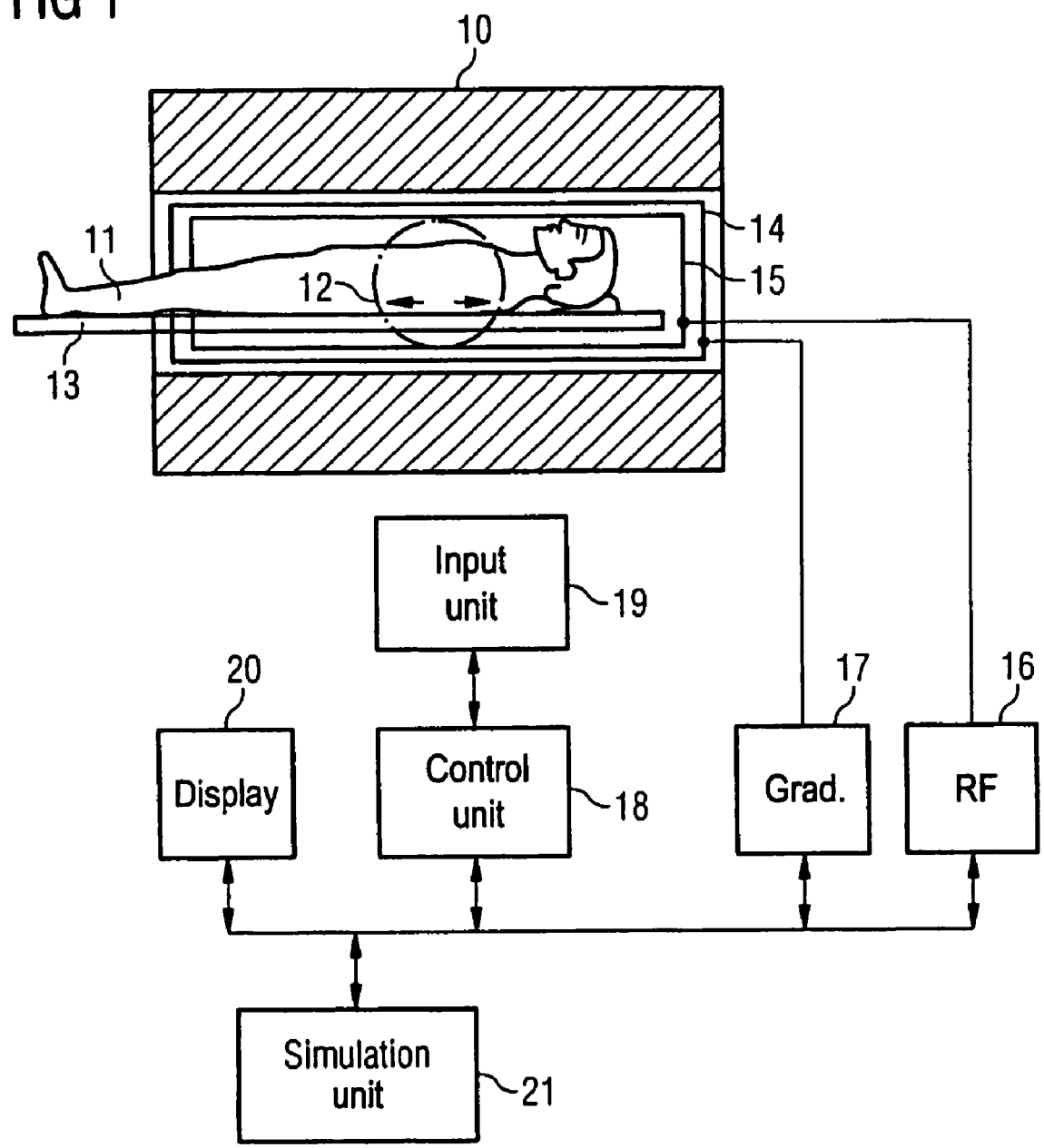
FIG. 1 schematically illustrates an MR system with a device for simulation of an MR image in accordance with the invention.

FIG. 1 schematically shows a magnetic resonance system with which the imaging parameters can be optimized in an effective manner. Such a magnetic resonance system possesses a basic magnetic field 10 for generation of a polarization field B0. An examination person 11 on a bed 13 is moved into the MR system to examine a body region 12. To generate MR images, the system possesses a radio-frequency coil system 14 for radiation of RF pulses for excitation of the magnetization arising in the polarization field. Gradient coils 15 are provided for spatial resolution of the MR signal. To control the radiation of the RF pulses, an RF unit 16 is provided to switch the gradient fields of a gradient unit 17. Furthermore, a central control unit 18 is provided to control the measurement and the measurement workflow, which control unit 18 can be operated by an operator (not shown) via an input unit 19. The MR image is displayed on a display unit 20. The functioning of an MR system is sufficiently known to those skilled in the art, such that details regarding the generation of the MR image need not be described in detail herein. The operator can input the imaging parameters via the input unit to generate an MR image. Such imaging parameters are, for example, repetition time, echo time, field of view, excitation flip angle etc. In order to now ensure that the measured MR image has a satisfactory image quality given a change of an imaging parameter, a simulation unit 21 is provided that calculates an image with the contrast and image quality to be expected, which image can then be displayed on the display unit 20.

Figure 2:
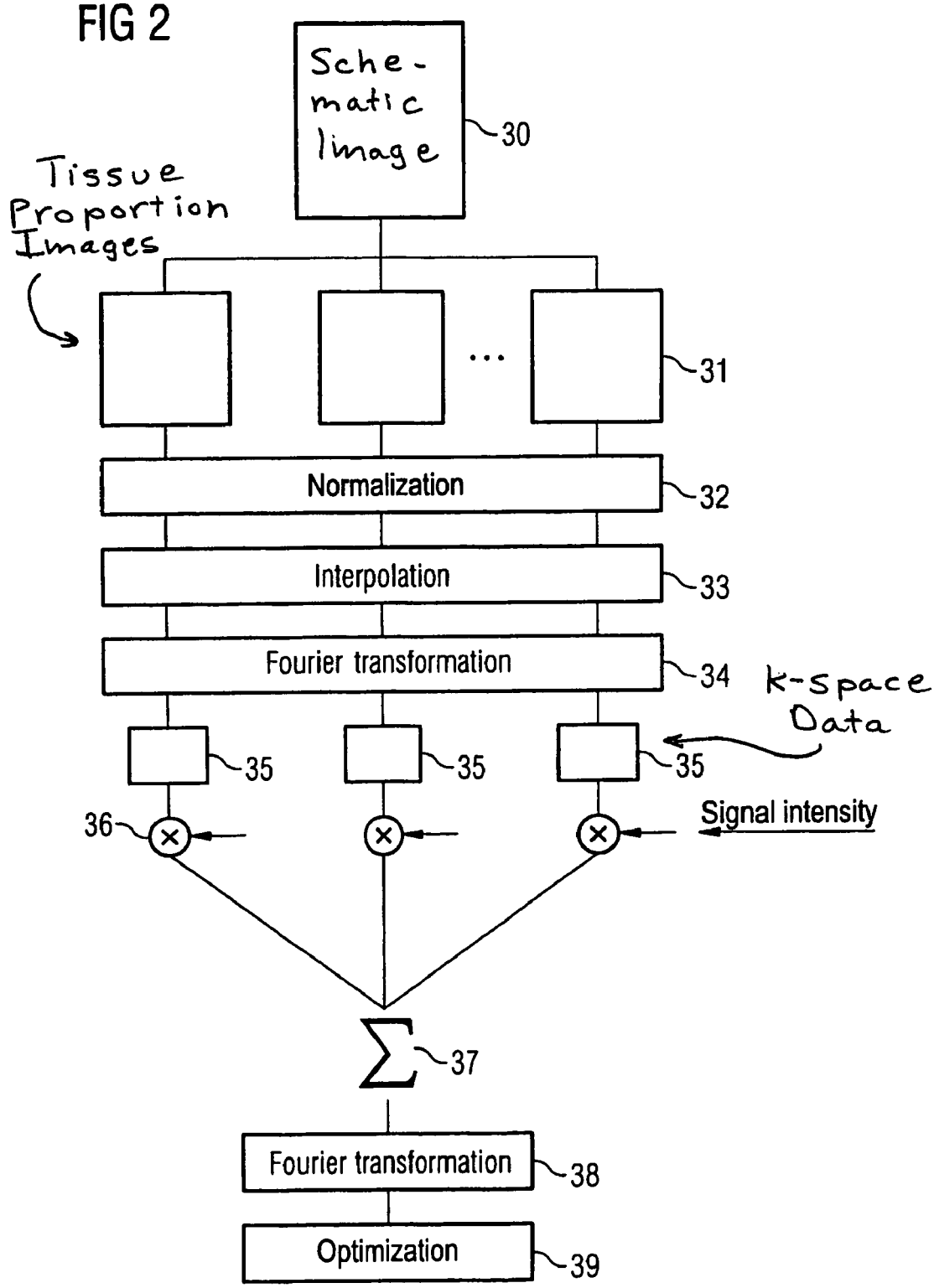
FIG. 2 is a flowchart that schematically shows a workflow embodiment for optimization of the imaging parameters in accordance with the invention.

Details as to how an MR image is simulated in the simulation unit 21 with the use of the set imaging parameters are presented in connection with FIGS. 2 and 3.

For the optimization method it is required to calculate an image based on a measurement protocol, which image corresponds to an actual measurement in contrast and image quality. For this purpose, a schematic image 30 is necessary that represents a segmented image that schematically reproduces the body region to be examined and in which an individual value (for example a grey value) is associated with each tissue type to be considered. Instead of the schematic image 30, multiple partial images can be used of which each precisely represents one tissue type. For example, the proportion of the associated tissue type can be coded in the pixel value of each partial image. Given three-dimensional acquisitions of the head with fast gradient echo sequences (known as MPRAGE imaging methods), a large number of imaging parameters can be modified, for example the type of the preparation of the magnetization (inversion recovery, double inversion recovery, T2 preparation, saturation recovery), preparation parameters such as inversion and saturation times, turbo-factor, flip angle parameters for the calculation of the variable flip angles, pixel bandwidth, etc. In order to acquire these three-dimensional images with optimal signal response, the signal response can now be simulated, wherein the tissue proportions are calculated based on the scheme image 30. As an example, a schematic image that is a segmented MR image of the brain is shown in image 41 in FIG. 3. Using the schematic image, a tissue proportion image 31 can now be generated for every tissue type occurring in the image, or for each tissue type that should be considered in the calculation. In the head, for example, it can be sufficient to consider three different tissue types in order to be able to calculate the most important clinical contrasts, namely the grey and white brain matters and fluid. In this application case, this would mean that three tissue proportion images 31 are generated. Each tissue proportion image shows only partial regions composed of a particular tissue type. The normalization of the individual partial images ensues in Step 32. Since multiple (different) tissues can be represented in a single pixel, the individual partial images must be normalized so that the total intensity is equal to 100%. Given transitions between tissue and air or given fluctuations of the local tissue density, individual pixels can also exhibit intensities that total less than 100%. In Step 33 the partial images are then interpolated based on the resolution set in the measurement protocol. In the shown exemplary embodiment, the interpolation occurs at the indicated point. However, it is also possible to implement the interpolation after the transformation in k-space (described later) or before generation of the partial images. In Step 34, each partial image is transformed in k-space via a Fourier transformation. This leads to k-space data 35 of each tissue proportion image. These data 35 indicate which tissue type has a signal portion at which k-space coordinates. In a next step 36 it must now be determined which signal intensity the signal of each tissue type has at each k-space coordinate, meaning that the weighting of the k-space data with the signal intensity occurs. This ensues by multiplication of each k-space coordinate of each transformed partial image with the associated signal intensity value. The calculated signal intensity value should correspond optimally well with the MR measurement signal upon acquisition of an MR image with the set imaging parameters. This intensity value can be calculated with the aid of a Bloch simulation, for example. In principle, the measurement workflow composed of excitation and refocusing pulses, magnetization preparations and gradient switchings can be numerically simulated for this, and in fact using the MR parameters known for each individual tissue type. For example, this can mean a simulation run for each tissue. The required signal intensity at the point in time of each data acquisition is obtained from this simulation. The associated k-space coordinate is therefore also known from the workflow of the measurement sequence since this results from the gradient switching. In order to keep the computation effort low, it can be necessary to not record the complete workflow of a measurement sequence in a Bloch simulation. However, due to the periodicity this is also not necessary since it is sufficient to simulate a representative part of the imaging sequence. If the MPRAGE sequence mentioned above is resorted to, the measurement workflow hereby consists of a preparation phase with subsequent readout train. This pair with a duration of (typically) 1-10 seconds is continuously repeated over a few minutes. In the repetition, different lines of k-space are filled in succession; however, the selection of the k-space lines has no influence on the Bloch simulation. For this reason it is sufficient to implement the Bloch simulation for a repetition and to effect the association of the signal intensities so determined with those in other (not simulated) repetitions via the associated scheme predetermined by the imaging sequence. If it is desired to incorporate equilibrium states, the simulation can also be calculated via a few repetitions (for example five). It is also possible to automatically establish the number of simulated repetitions N. If the magnetization of the start value at repetition N is compared with repetition N−1, the number of the required repetitions can be concluded from the deviation of the number. For example, if the deviation is smaller than a predetermined percentage, the repetitions can be stopped. The signal intensities can be calculated in a similar manner for other sequence types. For example, the calculation for a fast spin echo imaging (TSE, Turbo Spin Echo) turns out to be similar to that for the MPRAGE sequence; the representative part of the sequence likewise consists of a preparation and the readout train. For a gradient echo sequence, the representative part consists of a single excitation and the following detection. However, in this example it is necessary to consider equilibrium states and to simulate some repetitions (for example between 20 and 30). If the gradient echo sequence of additional sequence parts influencing the contrast is interrupted (such as, for example, fat suppression, regional saturation, etc.), the smallest repeating sequence block represents the representative part to be simulated.

The magnitude that a tissue proportion has in the total signal is now calculated for each tissue proportion in Step 36. This information is contained in the signal intensity value, wherein each k-space coordinate of each Fourier-transformed tissue proportion image is multiplied with the associated signal intensity value in Step 36. In Step 37, the transformed signal proportion images are then added in order to obtain the simulation image in Step 38 after a Fourier back-transformation into image space. Due to the linearity of the Fourier transformation, it is also possible to effect the addition of the k-space data according to Step 36 after the back-transformation into image space before Step 39. The simulation image calculated according to Step 38 can then be shown to the operator. An example of such a simulation image is recognizable in image 42 of FIG. 3. For demonstration purposes, in image 43 an MR image is presented that was measured with the imaging parameters that correspond to the imaging parameters of the simulation image. As can be seen by a comparison of images 42 and 43, the contrast response can be simulated relatively well. In Step 39, an optimization of the imaging parameters can then ensue using the calculated image. This means that either the operator changes the imaging parameters himself and starts a new simulation or, given satisfactory contrast, adopts the imaging parameters for the measurement sequence. However, in another exemplary embodiment it is also possible for the operator to only provide boundary conditions for the imaging parameters and to define the desired contrast, i.e. T1 weighting, T2 weighting or proton density weighting. Iterative images are now calculated with the calculation method described above and are automatically evaluated with regard to contrast quality and image quality. The imaging parameters can then be automatically modified dependent on the result of the evaluation and the next iteration can be implemented. The automatic evaluation can also already ensue on the basis of the determined intensity/weighting data and without knowledge of the spatial distribution of the tissue types (i.e. without scheme image); an iterative determination of optimal parameters thus can also ensue without explicit calculation of iterative images, which entails a significant reduction of the computation effort and thus an acceleration of the individual iteration steps.

The signal intensity for each readout interval individually results from the Bloch simulation for each tissue type. If, for example, the I echoes or an echo train of a MPRAGE sequence are acquired by the simulation, the signal intensities of the echo number i and tissue type Gj are obtained:

$$I(Gj, i)$$

The known association scheme Z of the sequence associates an echo number i with each k-space coordinate (kx, ky): $Z(kx, ky)=i$. The signal intensity $I(Gj, kx, ky)$ for each tissue type can be associated with each k-space coordinate with this information:

$$I(Gj, kx, ky)=I(Gj, Z(kx, ky))$$

This information already suffices for determination of essential image quality parameters such as signal, contrast or point spread function (see below); information about the spatial distribution of the tissue types (scheme image, tissue proportion images) are not yet necessary here:

Signal $S(Gj)=I(Gj, kx=0, ky=0)$

Contrast $K(G1, G2)=S(G1)/S(G2)$

PSF: $PSF(Gj)=\text{Sum}\_\{kx\}((I(Gj, kx, ky=Ky/2)-S(Gj))/S(Gj)^2$ (Ky indicates the number of the ky coordinates, meaning that the summation ensues over the central k-space column. Alternatively, the summation can also proceed over the central k-space line. Combined summations as well as related evaluations of the PSF are conceivable.)

Calculation of simulated images proceeds according to the following. Starting from the (possibly normalized) tissue proportion images $B(Gj, x, y)$, the k-space data $B(Gj, kx, ky)=FT(B(Gj, x, y))$ are calculated. FT designates the Fourier transformation. The k-space data are weighted with the previously determined signal intensities:

$$W(Gj, kx, ky)=B(Gj, kx, ky)*I(Gj, kx, ky)$$

The simulation image SB is obtained via summation and back-transformation:

$$SB(x, y)=FT\{-1\}(\text{Sum}\_jW(Gj, kx, ky))$$

For an automatic optimization it is necessary to indicate a target function to be optimized and a method to be used that iteratively modifies the optimization parameters such that the target function is maximized or minimized, for example. In a preferred embodiment, a minimization of the target function ensues, wherein in principle every known minimization method can be used. However, the simplex minimization method has proved to be particularly suitable since it requires no information about the mathematical derivations of the target function according to the optimization parameters, and even in a multi-parameter space the method can work from local minima to find the absolute minimum. For example, the following optimization parameters can be used: the point spread function of the individual tissue types, the signal-to-noise ratio as well as the contrast, i.e. the ratio of the signal amplitudes of the individual tissue types. It is necessary to include the evaluation parameters point spread function (PSF), signal-to-noise ratio (SNR) and contrast (K) in the target function, wherein the dependency on the tissue type (G) is added given the first two. For example, the individual contributions can contribute multiplicatively or in a weighted addition.

$$Z=PSF(G1)*PSF(G2)* \ldots *PSF(Gn)*SNR(G1)* \ldots *SNR(Gn)*K \qquad \text{i)}$$

$$Z=a1*PSF(G1)+ \ldots +an*PSF(Gn)*b1*SNR(G1)+ \ldots +bn*SNR(Gn)+c*K \qquad \text{ii)}$$

The evaluation of the contrast can ensue, for example, based on the amplitude ratios of the central k-space data of the individual tissue types, i.e. a ratio of the calculated signal intensities (see above). For example, if a good contrast is required between grey and white brain matter (GM or, respectively, WM), the contrast function $K=I(GM, kx=0, ky=0)/I(WM, kx=0, ky=0)$ can be minimized. The solution $I(GM, kx=0, ky=0)=0$ may possibly be precluded by the evaluation of the SNR; the evaluation of the SNR can likewise ensue over the amplitudes of the central k-space data. For example, the requirement of high SNR of GM an WM demands the minimization of $SNR(GM)=1/S(GM)$ and of $SNR(WM)=1/S(WM)$. The dependency of the SNR on the pixel bandwidth can, for example, be taken into account via the multiplication with the root of the bandwidth.

The evaluation of the point spread function is somewhat more complex: the ideal case (delta peak in image space) is reflected by a constant amplitude of the signal intensity in k-space. Deviations from this constant function manifest themselves in image space in an expansion of the point spread function (the images become blurry). The evaluation of the point spread function can therefore be registered, for example as a sum of the squares of the distances of the actual k-space amplitude from a constant: $PSF(GM)=\text{Sum}\_\{kx\} ((I(GM, kx, ky=Ky/2)-S(GM))/A(GM))^2$, $A(GM)=1/N \text{ Sum}\_\{kx\} (I(GM, kx, ky=Ky/2))$ or $A(GM)=S(GM)$. The signal intensities I required to calculate PSF already exist with the results of the Bloch simulations.

The method described herein are not limited to specific measurement sequences, but rather are applicable in principle to all imaging methods under the cited boundary conditions.

As can be recognized from the images shown in FIG. 3, the schematic image, the simulation image and the actual measurement show a large correlation of simulated and measured data. A parameter optimization is therefore possible without implementing tedious test subject measurements that would have lasted over 30 minutes in the example shown in FIG. 3.

The invention enables a time-saving and simple imaging parameter optimization.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining imaging parameters for acquiring data from an examination subject for reconstructing a magnetic resonance image of the examination subject from the data, comprising the steps of:
   establishing initial imaging parameters for acquiring magnetic resonance data from an examination subject with a magnetic resonance data acquisition unit;
   supplying said initial imaging parameters to a computer and calculating signal intensities in said computer for tissue that exist in at least a portion of the examination subject, using said initial imaging parameters and without using any acquired magnetic resonance signals, by mathematically determining tissue proportions from a body region of the examination that is at least partially in a region of the examination subject from which said magnetic resonance data are to be acquired; and
   adapting said initial imaging parameters dependent on the calculated signal intensities, to obtain adapted imaging parameters, and operating said magnetic resonance data acquisition unit with the adapted imaging parameters to acquire said magnetic resonance data from the examination subject; and
   in said computer, processing said magnetic resonance data acquired from the examination subject using the adapted imaging parameters to obtain image data representing a magnetic resonance image of the examination subject, and making said image data available as a data file at an output of said computer.

2. A method as claimed in claim 1 comprising automatically generating a simulation image in said computer from the calculated signal intensities that represents said portion of the examination subject.

3. A method as claimed in claim 2 comprising manually entering said initial imaging parameters in said computer by an operator, and changing said initial imaging parameters by said operator after reviewing said simulation image.

4. A method as claimed in claim 1 comprising determining magnetic resonance parameters of said tissue proportions.

5. A method as claimed in claim 1 comprising determining signal intensities for each tissue type, represented in said tissue proportions, in k-space.

6. A method as claimed in claim 5 comprising determining, in k-space respective ratios for each tissue proportion, and calculating the signal intensities for each tissue type by calculating, for at least one point in k-space, a signal intensity of the tissue type at said point and a proportion of each tissue type at said point.

7. A method as claimed in claim 5 comprising calculating the signal intensity in k-space based on the Bloch equations.

8. A method as claimed in claim 1 comprising determining the respective tissue portions using a schematic image that schematically reproduces said body region.

9. A method as claimed in claim 8 comprising employing a segmented magnetic resonance image as said schematic image.

10. A method as claimed in claim 8 comprising generating a tissue proportion image from said schematic image for each tissue proportion, thereby obtaining a plurality of tissue proportion images.

11. A method as claimed in claim 10 comprising normalizing said tissue proportion images.

12. A method as claimed in claim 11 comprising adapting a resolution of the respective tissue proportion images to correspond to a resolution of a magnetic resonance image to be reconstructed from said magnetic resonance data.

13. A method as claimed in claim 10 comprising Fourier transforming said tissue proportion images in k-space.

14. A method as claimed in claim 13 comprising multiplying the signal intensity of each tissue type in k-space with the Fourier-transformed tissue proportion image, to generate a tissue-dependent intensity image.

15. A method as claimed in claim 14 comprising adding the tissue-dependent signal intensities to generate a simulation image therefrom.

16. A method as claimed in claim 15 comprising calculating a simulation image for each of three orthogonal slice planes in the examination subject.

17. A method as claimed in claim 15 comprising calculating the signal intensities only in a temporal sub-range of an imaging sequence used to acquire said magnetic resonance data.

18. A method as claimed in claim 17 comprising employing, as said sub-range, a smallest repeating unit in said imaging sequence.

19. A method as claimed in/claim 1 comprising, after establishing said initial imaging parameters, providing a range for said imaging parameters and a range for image quality parameters, and iteratively calculating said signal intensities in said computer dependent on the ranges.

20. A method as claimed in claim 19 comprising calculating said signal intensities and adapting said imaging parameters in an iterative procedure employing a minimization of a target function.

21. A method as claimed in claim 19 comprising, from the calculated signal intensities, calculating image quality parameters based on the imaging parameters that are adapted.

22. A method as claimed in claim 1 comprising selecting a measurement protocol for acquiring said magnetic resonance data with predetermined ones of said imaging parameters, and automatically calculating and displaying a simulation image based on said ones of said parameters in said measurement protocol.

23. A method as claimed in claim 1 comprising, for each of a plurality of different measurement protocols for acquiring said magnetic resonance data, generating and displaying a simulation image from the signal intensities calculated for that measurement protocol.

24. A magnetic resonance tomography apparatus comprising:
   a magnetic resonance scanner that interacts with an examination subject to acquire magnetic resonance data from the examination subject;
   an input unit that allows entry of initial imaging parameters to be subsequently used for acquiring said magnetic resonance data from a body region of the examination subject;
   a computer connected to said input unit and supplied with said initial imaging parameters, said computer being configured to automatically calculate signal intensities for tissue types existing in at least a part of said body region, said computer calculating said signal intensities without using any acquired magnetic resonance signals by mathematically determining tissue proportions from a body region of the examination that is at least partially in a region of the examination subject from which said magnetic resonance data are to be acquired said computer being configured to calculate a simulation image from said signal intensities; and
   a display unit connected to said computer and located in proximity to said input unit to allow a user to simultaneously view said display and operate said input unit, said computer displaying said simulation image at said display.

25. A non-transitory computer readable storage medium encoded with programming instructions, said computer readable storage medium being loaded into a computer of a magnetic resonance imaging apparatus having a magnetic resonance data acquisition unit from which magnetic resonance data are acquired from an examination subject and having input unit allowing entry of initial imaging parameters for use in subsequently acquiring said magnetic resonance data, said programming instructions causing said computer to:

from said initial imaging parameters, calculate signal intensities for tissue types existing in at least a portion of a body region of the examination subject from which the magnetic resonance data are to be acquired, without using any acquired magnetic resonance signals from the examination subject, by mathematically determining tissue proportions from a body region of the examination that is at least partially in a region of the examination subject from which said magnetic resonance data are to be acquired in the calculation of said signal intensities; and calculate a simulation image from said signal intensities, and make said simulation image available at an output of the computer as video signals in a form allowing said simulation image to be displayed at a display unit.

* * * * *